(12) United States Patent
Fujimura et al.

(10) Patent No.: US 6,690,079 B2
(45) Date of Patent: Feb. 10, 2004

(54) LIGHT-RECEIVING DEVICE

(75) Inventors: Yasushi Fujimura, Yokohama (JP);
Hiroshi Yano, Yokohama (JP);
Tsukuru Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 10/121,672

(22) Filed: Apr. 15, 2002

(65) Prior Publication Data
US 2002/0149827 A1 Oct. 17, 2002

(30) Foreign Application Priority Data

Apr. 16, 2001 (JP) ...................................... P2001-117291

(51) Int. Cl.[7] .............................................. H01L 31/00
(52) U.S. Cl. ......................... 257/460; 257/228; 257/458
(58) Field of Search ................................ 257/228, 458, 257/460

(56) References Cited

U.S. PATENT DOCUMENTS

| | | | | |
|---|---|---|---|---|
| 5,300,788 A | * | 4/1994 | Fan et al. ..................... | 257/13 |
| 5,684,308 A | * | 11/1997 | Lovejoy et al. .............. | 257/184 |
| 5,880,489 A | * | 3/1999 | Funaba et al. ............... | 257/184 |
| 6,043,550 A | * | 3/2000 | Kuhara et al. ............... | 257/461 |
| 6,081,020 A | * | 6/2000 | Frahm et al. ................ | 257/458 |

FOREIGN PATENT DOCUMENTS

JP          05267708 A    * 10/1993    ........... H01L/31/10

* cited by examiner

*Primary Examiner*—Allan R. Wilson
(74) *Attorney, Agent, or Firm*—Smith, Gambrell & Russell, LLP (57) ABSTRACT

The invention relates to a back-illuminated type light-receiving device. The light-receiving device can be used for a wide frequency range. The device has a structure in which a p-type semiconductor layer and an n-type semiconductor layer are successively stacked on the front side of the semiconductor substrate. A light-receiving portion is provided on the back side of the substrate. A dopant diffusion suppressing layer may be provided between the substrate and the p-type layer.

10 Claims, 8 Drawing Sheets

LIGHT-RECEIVING DEVICE

BACKGROUND OF THE INVENTION

1. Field of the Invention

The present invention relates to a light-receiving device for carrying out photoelectric conversion; and, in particular, to a back-illuminated type light-receiving device.

2. Related Background Art

A typical back-illuminated type photodiode comprises an n-type semiconductor layer disposed on the front side of a semiconductor substrate, and a p-type semiconductor layer disposed on the n-type layer. A pn junction is formed between the n-type layer and the p-type layer. On the back side of the substrate, an optical lens is provided as a light-receiving portion. Light enters the photodiode by way of the optical lens.

When a reverse bias voltage is applied between the p-type layer and n-type layer in such a photodiode, an i-type layer, which is a depletion region, is provided in the pn junction between the p-type and n-type layers. When light enters the i-type layer after passing through the substrate from the light-receiving portion, electron-hole pairs (carriers) are generated. According to the internal electric field in the i-type layer, the electrons and holes move to the n-type layer and p-type layer, respectively.

When light enters into such a back-illuminated photodiode, the magnitude of light within the i-type layer is larger as the position is closer to the n-type layer. The light exponentially decreases as the position is farther from the n-type layer. Therefore, a larger number of carriers (electron-hole pairs) are generated in the i-type layer as the position is closer to the n-type layer. Thus, the behavior of electron-hole pairs generated near the n-type layer greatly influences output characteristics of the photodiode.

When a electron-hole pair is generated near the n-type layer in a conventional photodiode, the hole travel a longer distance than the electron does. This is because that the distance from the region where the electron-hole pair is generated to the p-type layer is longer than the distance therefrom to the n-type layer. The drift velocity of a hole is smaller than that of an electron. Therefore, a large difference exists between respective times at which the concurrently generated electron and hole reach the n-type layer and p-type layer. The time difference reduces frequency performance of the photodiode. Such a problem appears for the incident light with a high frequency region (e.g., a frequency of 10 GHz or 40 GHz) when the magnitude of incident light is large and the reverse bias voltage applied across the pn junction is low. That is the reason why the photodiode has the restricted frequency range.

SUMMARY OF THE INVENTION

It is an object of the present invention to provide a back-illuminated type light-receiving device with an improved frequency characteristic, which is usable for a higher frequency region.

The light-receiving device in accordance with the present invention comprises a semiconductor substrate and a semiconductor layer disposed on the front side of the substrate. The semiconductor layer includes a p-type layer and an n-type layer. The p-type layer contains a p-type dopant. The n-type layer is disposed above the p-type layer. An i-type layer may be disposed on the upper surface of the p-type layer, and the n-type layer may be disposed on the upper surface of the i-type layer. The p-type layer and n-type layer may be in contact with each other to form a pn junction therebetween. A light-receiving portion for receiving light entering the light-receiving device is provided on the back side of the substrate. The p-type layer and light-receiving portion are disposed on the opposite surfaces of the substrate, respectively. An anode may be in contact with the p-type layer. A cathode maybe in contact with the n-type layer.

For many of the electron-hole pairs in the light-receiving device in accordance with the invention, the distance that the electrons travel to reach the n-type layer is greater than the distance that the holes travel to reach the p-type layer. The drift velocity of an electron is faster than that of a hole. Therefore, the time difference for the concurrently generated electron and hole to reach the respective n-type and p-type layers can be reduced. Thus, the light-receiving device can respond to a wide range of the frequencies of incident optical signals.

In the light-receiving device, the light-receiving portion may be integrally formed on the substrate. In this case, the light-receiving device is easy to align with a light-emitting unit.

The light-receiving device may further comprise a diffusion suppressing layer of dopant between the substrate and p-type layer. The diffusion suppressing layer restrains diffusion of the p-type dopant from the p-type layer into the substrate. This can reduce the amount of the dopant-diffused portion to be removed from the substrate and eliminate the removal of the portion in making the light-receiving device.

Preferably, the light-receiving device is isolated. In this case, the light-receiving device is less likely to be electrically influenced by semiconductor crystal surfaces. The device isolation may be carried out by etching.

Preferably, the portion of the substrate into which the p-type dopant diffuses from the p-type layer is removed. In this case, the front side of the substrate may have first and second regions with different heights. The first region is higher than the second region. The p-type layer and n-type layer are disposed on the first region. The concentration of the p-type dopant in the second region is lower than that in the first region. The second region may be formed by removing the dopant-diffused portion from the substrate. The dopant-diffused portion may be removed by etching. For example, the dopant-diffused portion may be removed during etching for device isolation.

The diffusion suppressing layer of dopant may be an Si-doped layer. The p-type layer and n-type layer may have a mesa structure. The p-type layer may be provided by an epitaxial growth technique. The light-receiving portion may be an optical convex lens.

The dopant in the p-type layer may be carbon. In this case, the dopant diffusion into the substrate can be restrained.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications in the spirit and scope of the invention will become apparent to those skilled in the art from this detailed description.

DETAILED DESCRIPTION OF THE PREFERRED EMBODIMENTS

In the following, embodiments of the light-receiving device in accordance with the present invention will be explained in detail with reference to the drawings. In the explanation of the drawings, portions identical or equivalent to each other will be referred to with numerals identical to each other without repeating their overlapping descriptions.

Figure 1:
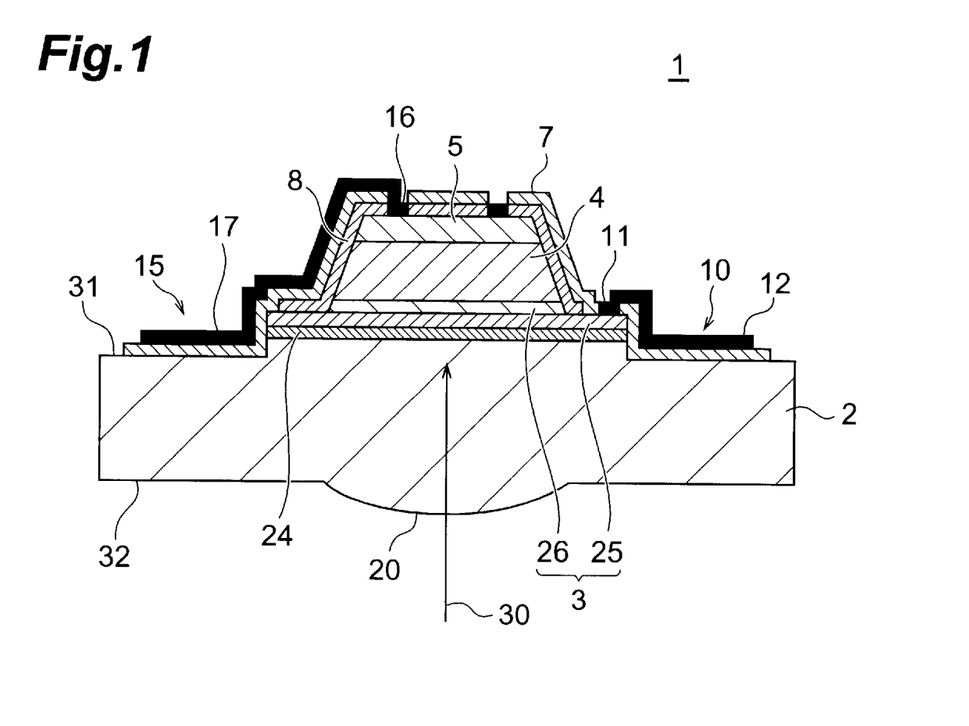
FIG. 1 is a sectional view of an embodiment of the light-receiving device in accordance with the present invention.

FIG. 1 is a sectional view showing the overall structure of the light-receiving device in accordance with an embodiment of the invention. The light-receiving device 1 is a photodiode of mesa type and back-illuminated type. The light-receiving device 1 comprises a semiconductor substrate 2, a p-type semiconductor layer 3, an i-type semiconductor layer 4, and an n-type semiconductor layer 5. These semiconductor layers 3 to 5 are successively stacked on the substrate 2. The substrate 2 transmits light therethrough in a wavelength band to be detected by the light-receiving device 1. The substrate 2 is made of semi-insulating InP. Each of the p-type layer 3, i-type layer 4, and n-type layer 5 is made of InGaAs. The p-type layer 3, i-type layer 4, and n-type layer 5 have thicknesses of 0.31 µm, 2.3 µm, and 0.3 µm, respectively.

The p-type layer 3 is constituted by a lower layer 25 and an upper layer 26. The lower layer 25 is located close to the substrate 2. The lower layer 25 ($p^{++}$InGaAs) contains a p-type dopant at a high concentration. The thickness of the lower layer 25 is 0.2 µm. The upper layer 26 is located adjacent to the i-type layer 4. The upper layer 26 contains the p-type dopant at a concentration lower than that in the lower layer 25. In the p-type layer 3, only the upper layer 26 has a mesa structure.

Between the substrate 2 and p-type layer 3, a diffusion suppressing layer 24 of dopant is provided. The layer 24 has a thickness of 0.01 µm. The layer 24 will be explained later in detail.

On the surfaces of the semiconductor layers, an outer passivation film 7 and an inner passivation film 8 are provided. The outer passivation film 7 is made of SiN. The inner passivation film 8 is made of undoped InP. The passivation films 7 and 8 block contaminants to maintain characteristics of the light-receiving device 1.

On the back side 32 of the substrate 2, a light-receiving portion 20 for receiving incident light 30 is provided. The light-receiving portion 20 is integrally formed on the back side 32. In this embodiment, the light-receiving portion 20 is a convex monolithic lens (optical lens). The lens surface is AR-coated. Therefore, in this embodiment, the incident light 30 can be condensed or collimated toward a semiconductor light-receiving area inside the device 1.

As mentioned above, the light-receiving portion 20 and substrate 2 can be formed integrally with each other in the back-illuminated type light-receiving device 1. In general, if light emitted from an optical fiber is to be detected by a light-receiving device, an optical axis needs to be formed between the optical fiber, an optical lens, and the semiconductor light-receiving area. When the optical lens and light-receiving device are separate from each other, alignment between the lens and fiber, and alignment between the lens and light-receiving device are necessary. In contrast, when the lens is integrally formed with the substrate, only the alignment between the lens and fiber is necessary. This is an advantage of the light-receiving device 1 in accordance with the embodiment.

The device 1 further comprises two electrodes 10 and 15. The electrode 10 is an anode, and the electrode 15 is a cathode. These electrodes are disposed on the substrate 2 with the passivation film 7 interposing therebetween. The anode 10 is in contact with a portion of the p-type layer 3. The cathode 15 is in contact with a portion of the n-type layer 5. The anode 10 is constituted by a contact electrode 11 and an electrode pad 12. The contact electrode 11 is in contact with the surface of the lower layer 25 of the p-type layer 3. The electrode pad 12 is an electrode for wiring to the light-receiving device 1. The electrode pad 12 is connected to the contact electrode 11. Similarly, the cathode 15 is constituted by a contact electrode 16 and an electrode pad 17. The contact electrode 16 is in contact with the surface of the n-type layer 5. The electrode pad 17 is an electrode for wiring to the light-receiving device 1, and is connected to the contact electrode 16. The current generated by photoelectric conversion in the light-receiving device 1 is taken out by way of the anode 10 and cathode 15.

Figure 2:
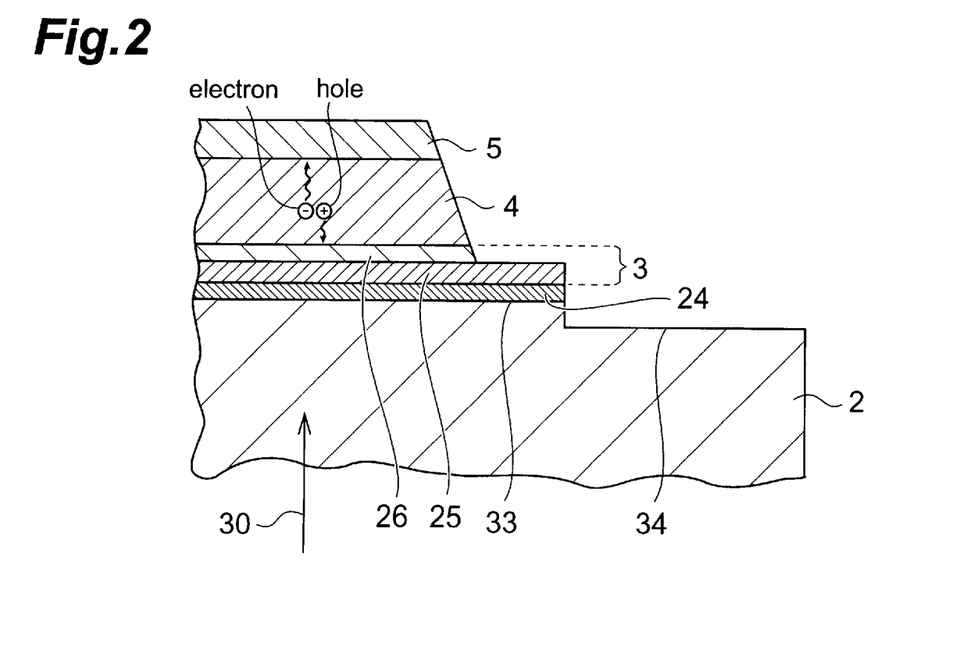
FIG. 2 is a partly enlarged view of the light-receiving device shown in FIG. 1.

FIG. 2 is a partly enlarged sectional view of the light-receiving device 1 shown in FIG. 1. The photoelectric conversion in the device 1 will now be explained in brief with reference to FIG. 2. The light 30 entering via the light-receiving portion 20 is transmitted through the substrate 2 to enter the p-type layer 3. When the light passes through the layer 3 and then enters the i-type layer 4, electron-hole pairs (carriers) are generated in the i-type layer 4. According to the internal electric field in the i-type layer 4, the electrons and holes move to the n-type layer 5 and p-type layer 3, respectively. The magnitude of light in the i-type layer 4 is larger in the region closer to the p-type layer 3, and becomes small in the region farther from the p-type layer 3. Therefore, a larger number of carriers (electron-hole pairs) are generated in the region closer to the p-type layer 3. Thus, the behavior of electron-hole pairs generated near the p-type layer 3 greatly influences output characteristics of the photodiode. The behavior will be studied in the following.

When electron-hole pairs are generated near the p-type layer 3 in the i-type layer 4, the distance from the generation points to the n-type layer 5 is longer than the distance from the generation points to the p-type layer 3. The electrons drift to the n-type layer 5, and the holes-drift to the p-type layer 3. The velocity of an electron is faster than that of a hole. Thus, the electrons with a faster velocity travel a longer distance, while the holes with a slower velocity travel a shorter distance. Therefore, the concurrently generated electron and hole reach the n-type layer 5 and p-type layer 3, respectively, with a minimized time difference. Consequently, the device 1 has improved light-receiving sensitivity, and carries out effective photoelectric conversion.

In general, when light with a short wavelength enters a light-receiving device, the light does not penetrate deeply into a semiconductor layer but is significantly absorbed inside the layer near its surface. Most of photons generate carriers near the surface. Therefore, the difference in transit time for carriers is a serious problem. The light-receiving device 1 in accordance with the embodiment overcomes such a disadvantage by the configuration mentioned above.

An electric field inhibiting carriers from traveling occurs in the conventional light-receiving device when the reverse bias voltage is low or when the magnitude of incident light is large. The electric field yields a problem that influences of space-charge effect are likely to occur. It is presumed that the problem is caused by generation of oppositely directed internal electric field in a portion of the i-type layer. In the device 1, the traveling distances are relatively short for most of the holes, which have a relatively slow speed. This can suppress the influences of space-charge effect.

The diffusion suppressing layer 24 of dopant will now be explained. The layer 24 is disposed between the p-type layer 3 and substrate 2. The layer 24 inhibits dopants in the p-type layer 3 from diffusing into the substrate 2. In the embodiment, the layer 24 is a Si-doped layer. Zinc (Zn) is used as a dopant for the p-type layer 3. In general, when forming a p-type layer on a semiconductor substrate by an epitaxial growth technique or when carrying out an annealing process (heating process), dopants in the p-type layer diffuse into the substrate. In particular, Zn is likely to diffuse. This causes the dopant-diffused portion in the substrate to change into p-type semiconductor (which will hereinafter be referred to as "p-conversion"). In the device 1 in accordance with the embodiment, the diffusion suppressing layer 24 suppresses the p-conversion of the substrate 2.

Carbon (C) may be used as a dopant for the p-type layer 3 in place of Zn. Carbon has a diffusion coefficient smaller than that of zinc, thus being harder to diffuse in the p-type layer 3. Carbon is also advantageous in that it can be used for doping at a high concentration (up to $10^{20}$ cm$^{-3}$). Therefore, the diffusion suppressing layer 24 may be omitted when carbon is used.

When the light-receiving device 1 was formed without the diffusion suppressing layer 24, Zn diffused from the front side of the substrate 2 into a depth of 0.7 μm to 0.8 μm. When the device 1 was formed with the diffusion suppressing layer 24, by contrast, the depth of the diffused portion was decreased to 0.4 μm.

Preferably, the p-converted portion of the substrate 2 is removed, by etching and the like. This will be explained later.

FIGS. 3A to 3D and 4A to 4D show steps of making the light-receiving device 1 in accordance with the embodiment. The manufacturing steps will now be explained with reference to these drawings.

Figure 3A:
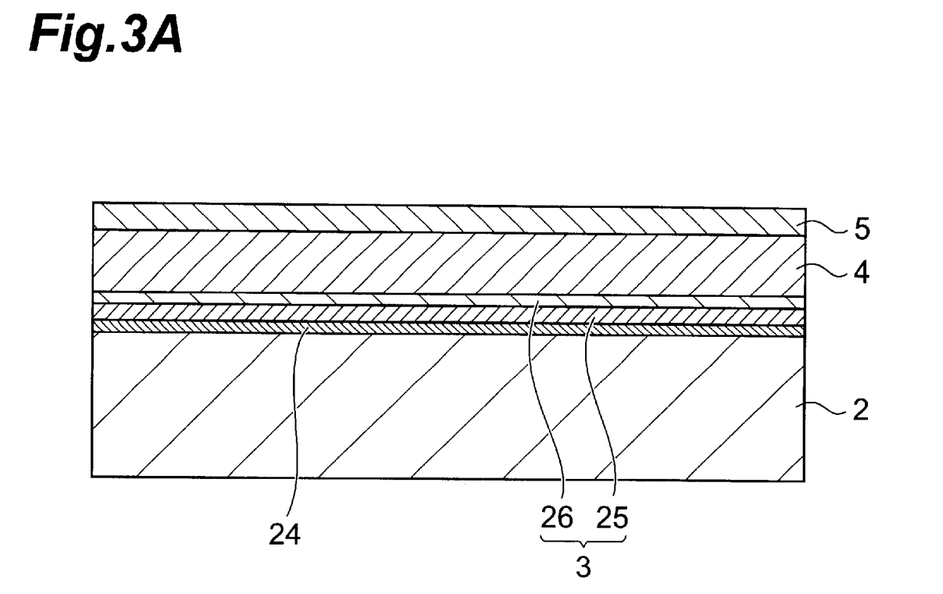
FIGS. 3A to 3D and 4A to 4D show steps of making the light-receiving device in accordance with the embodiment.

First, as shown in FIG. 3A, the substrate 2 is prepared and, on the whole front side thereof, the dopant diffusion suppressing layer 24, p-type layer 3, i-type layer 4, and n-type layer 5 are successively formed. These layers are formed by using an epitaxial growth technique. The lower layer 25 of the p-type layer 3 is initially formed on the diffusion suppressing layer 24. Thereafter, the upper layer 26 is formed on the lower layer 25.

The diffusion suppressing layer 24 is initially formed as an n-type semiconductor layer on the substrate 2. The p-type layer 3 is formed on the upper surface of the layer 24 by the epitaxial growth technique. At that time, dopants (Zn) in the p-type layer 3 diffuse into the layer 24. As a result, the layer 24 finally becomes a p-type semiconductor layer. Thus, when growing the suppressing layer 24 on the substrate 2, the layer 24 is formed as an n-type layer containing no p-type dopants. This prevents p-type dopants from diffusing into the substrate 2. Thereafter, when the p-type layer 3 is formed on the diffusion suppressing layer 24, dopants (Zn) in the p-type layer 3 diffuse and penetrate into the substrate 2. Since the diffusion suppressing layer 24 is interposed between the substrate 2 and p-type layer 3, however, the diffusion into the substrate 2 is suppressed.

Figure 3B:
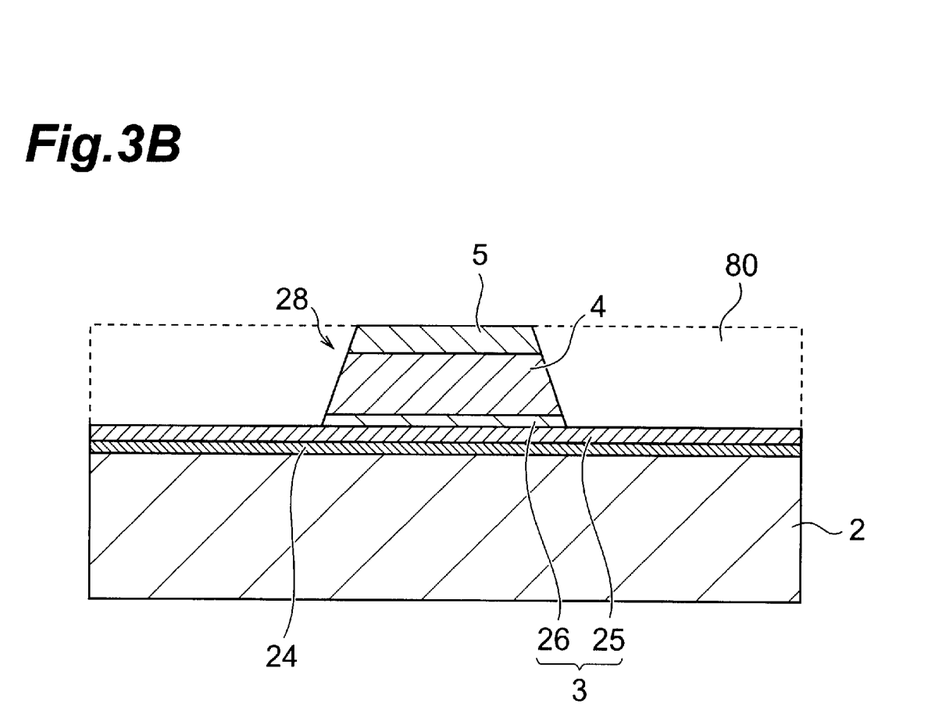
Figure 3C:
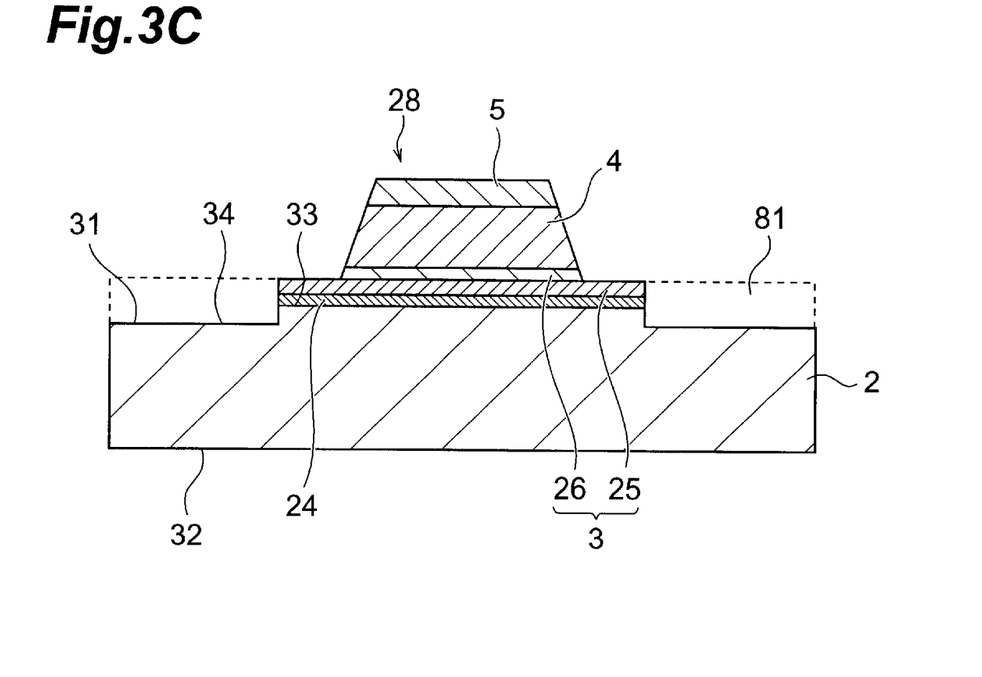

Subsequently, as shown in FIGS. 3B and 3C, a mesa structure 28 is formed in the light-receiving device 1 by etching, and then dry etching or wet etching is carried out for device isolation. These two etching processes will be explained in the following.

The etching process for forming the mesa structure 28 removes a portion 80 shown in FIG. 3B. That is, a portion of the n-type layer 5 (the portion having a thickness of 0.1 μm), a portion of the i-type layer 4 (the portion having a thickness of 2.3 μm), and a portion of the upper layer 26 of the p-type layer 3 (the portion having a thickness of 0.1 μm) are removed. As a result, the n-type layer 5, i-type layer 4, and upper layer 26 are formed into the mesa structure 28. The thickness of the removed portion 80 is 2.5 μm.

The etching process for device isolation removes a portion 81 shown in FIG. 3C. That is, a portion of the lower layer 25 of p-type layer 3 (the portion having a thickness of 0.20 μm), a portion of the diffusion suppressing layer 24 (the portion having a thickness of 0.01 μm), and a portion of the surface layer portion of the substrate 2 are removed. Specifically, in the substrate 2, the p-converted portion with a thickness of 0.1 μm, which is formed by the dopant diffusion from the p-type layer 3, is removed. The removed portion 81 has a thickness of 0.31 μm.

The portion 81 surrounds the mesa structure 28. Therefore, the p-converted portion of the substrate 2 is removed from the periphery of the mesa structure 28. This can prevent the light-receiving device 1 from being electrically influenced by semiconductor crystal surfaces. Consequently, the light-receiving device 1 generates no MIS (Metal-Insulator-Semiconductor) capacity.

When the portion 81 is removed, a step structure is provided on the front side 31 of the substrate 2. That is, the front side 31 includes faces 33 and 34 with different heights. The higher face 33 supports the diffusion suppressing layer 24, p-type layer 3, i-type layer 4, and n-type layer 5. The lower face 34 is formed by the removal of the p-converted portion from the substrate 2. Therefore, the concentration of the p-type dopant in the lower face 34 is lower than that in the higher face 33.

The light-receiving device 1 comprises the diffusion suppressing layer 24, so that the amount of etching for removing the p-converted layer in the substrate 2 can be suppressed to 2.81 μm (2.5 μm+0.31 μm). This can reduce the general irregularity of the device 1. Therefore, the device 1 is less likely to cause problems on process, such as separating and cutting of wiring lines. Problems on process are likely to occur if the general irregularity exceeds 3.5 μm.

As mentioned above, the step of forming the diffusion suppressing layer 24 can be omitted when carbon is used as a dopant for the p-type layer 3. Since the diffusion into the substrate 2 is less likely to occur, the amount of etching for device isolation can be reduced. As a result, the manufacturing process can be simplified. Also, the light-receiving device with smaller irregularity can be obtained.

Figure 3D:
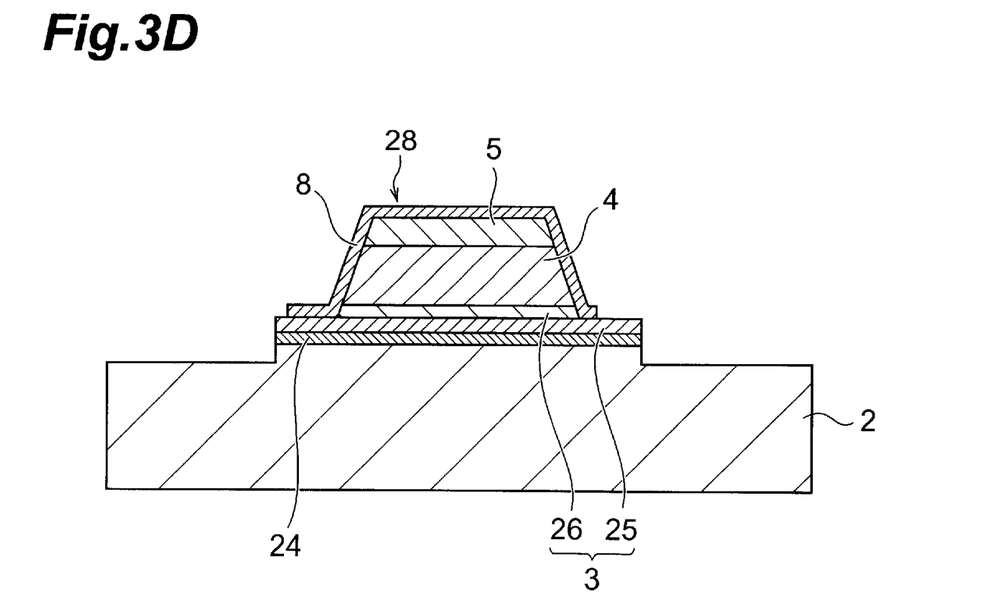

After the etching processes, the inner passivation film 8 (undoped InP) is formed on the surface of the mesa structure 28 as shown in FIG. 3D. The inner passivation film 8 partly covers the surface of the lower layer 25 of the p-type layer 3 as well.

Figure 4A:
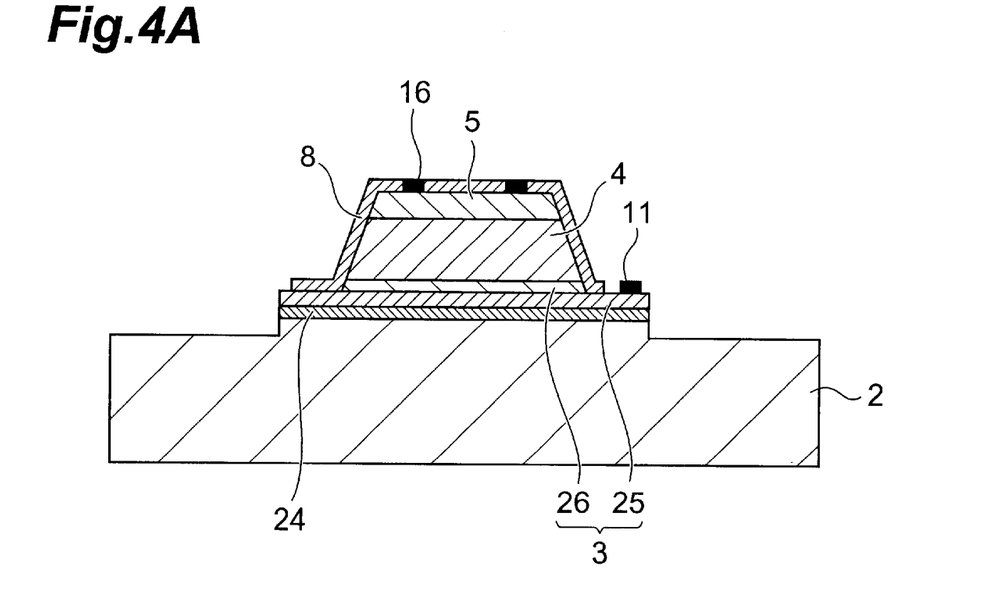

Subsequently, as shown in FIG. 4A, the contact electrodes 11 and 16 are formed. The electrode 11 is in contact with the surface of the lower layer 25 of the p-type layer 3. The electrode 16 penetrates through the inner passivation film 8 to come into contact with the surface of the n-type layer 5.

Figure 4B:
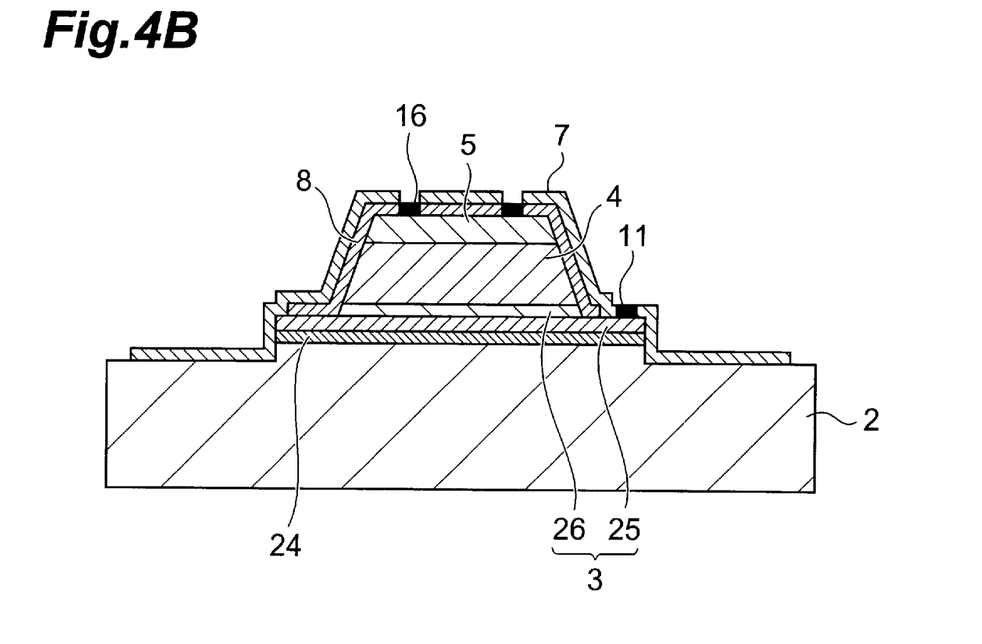

As shown in FIG. 4B, after the contact electrodes 11 and 16 are formed, the outer passivation film 7 (SiN) is formed in order to protect the surface of the device 1. The outer passivation film 7 is formed with openings for exposing the electrodes 11 and 16.

Figure 4C:
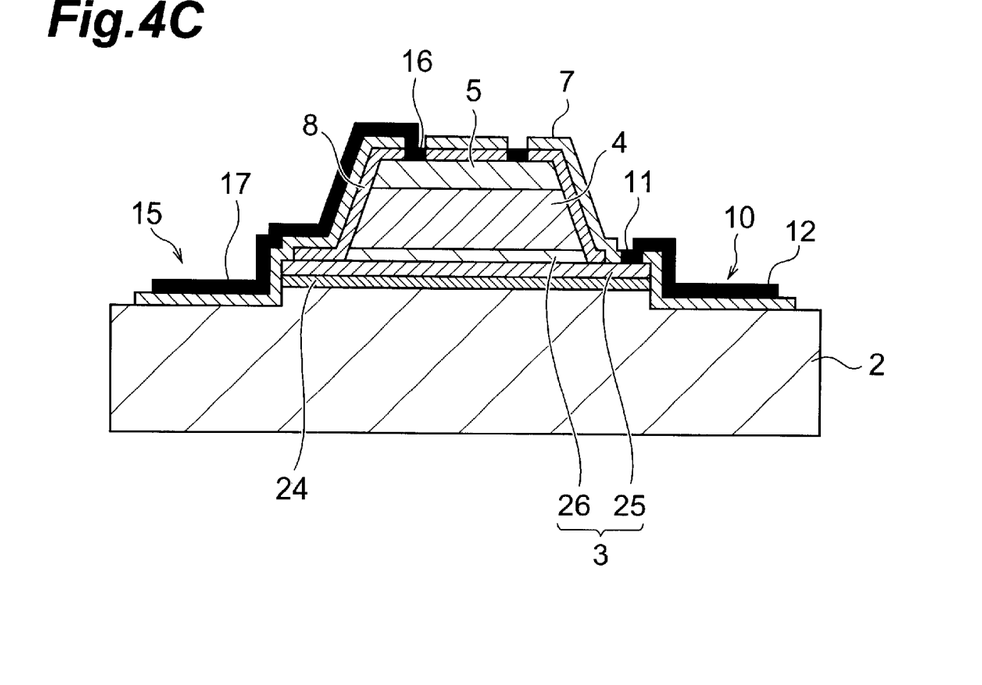

Subsequently, as shown in FIG. 4C, the electrode pads 12 and 17 are formed. As a result, the anode 10 and cathode 15 are formed. The electrode pad 12 is connected to the contact electrode 11. The electrode pad 17 is connected to the contact electrode 16. The electrode pads 12, 17 extend along their lengths. This enables wiring to the device 1.

Figure 4D:
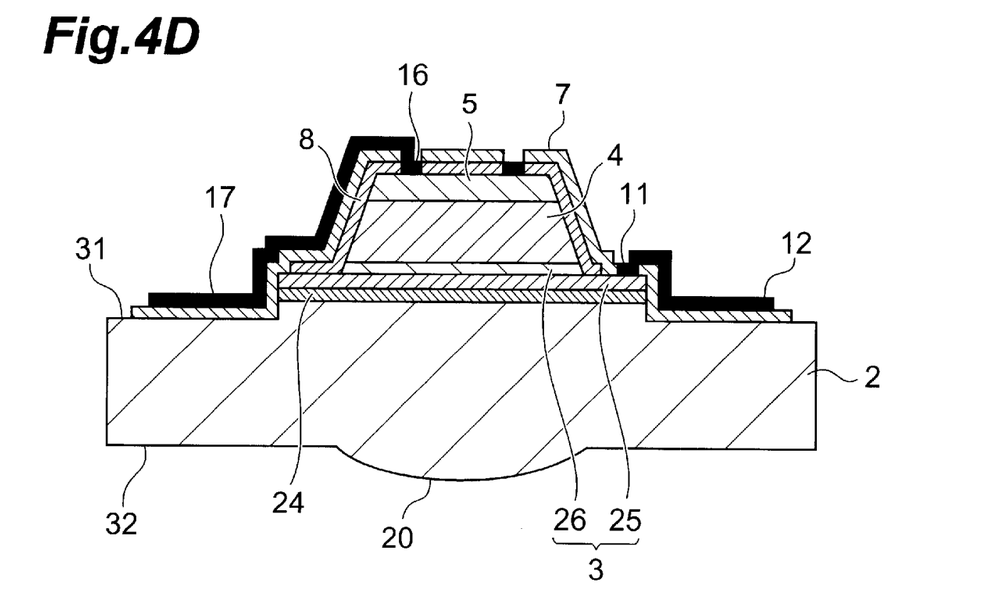

Thereafter, as shown in FIG. 4D, the back side 32 of the substrate 2 is processed to form the light-receiving portion 20. The light-receiving portion 20 is an optical convex lens. The light-receiving portion 20 is integrally formed on the back side 32 of the substrate 2. This completes the manufacturing of the device 1 in accordance with the embodiment.

Figure 5A:
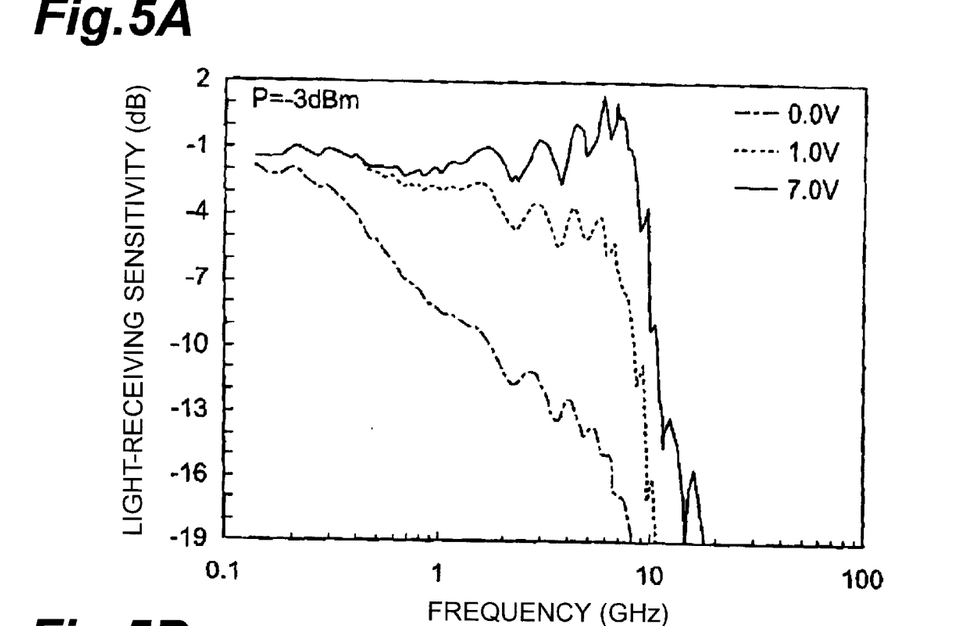
FIGS. 5A and 5B show output response characteristics of a conventional light-receiving device.
Figure 5B:
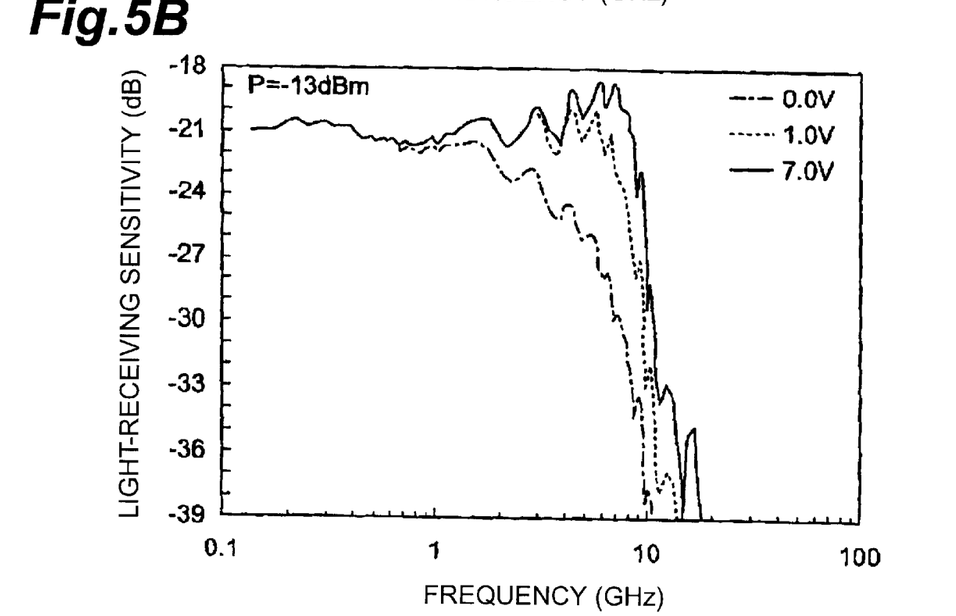
Figure 6A:
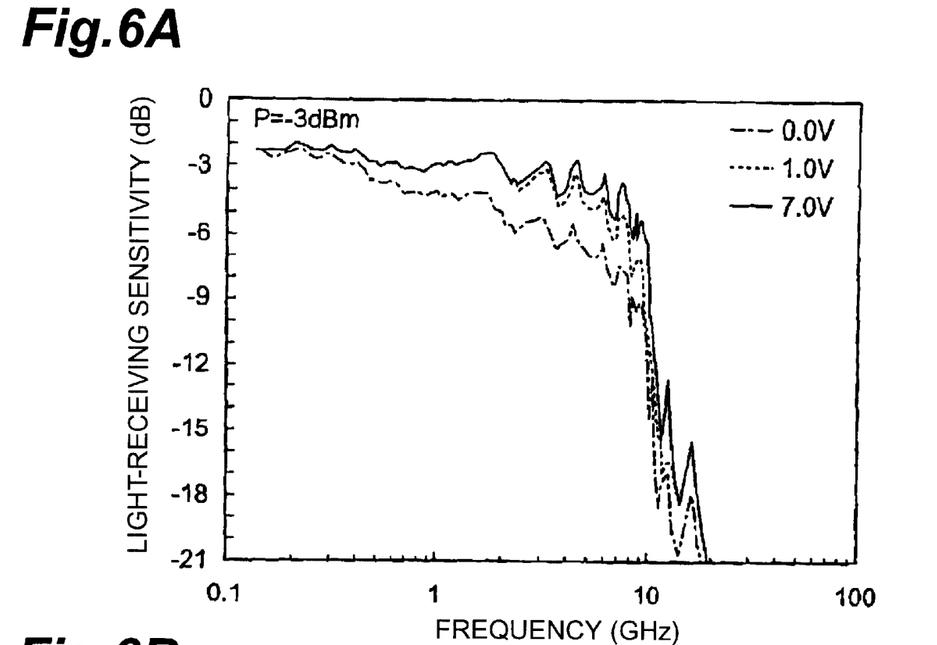
FIGS. 6A and 6B show output response characteristics of the light-receiving device in accordance with the embodiment.
Figure 6B:
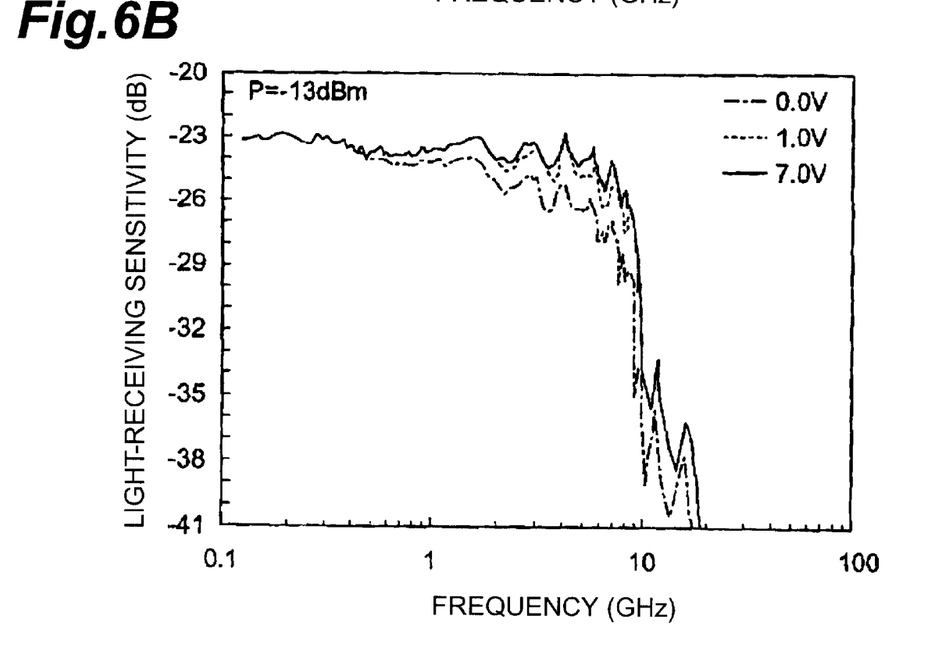

Referring to FIGS. 5A to 6B, advantages of the light-receiving device in accordance with the embodiment will be explained. FIGS. 5A and 5B show output response characteristics of a conventional light-receiving device. FIGS. 6A and 6B show output response characteristics of the light-receiving device in accordance with the embodiment. In each graph, the abscissa indicates frequency (GHz), and the ordinate indicates the light-receiving sensitivity of the light-receiving device in terms of dB. FIGS. 5A and 6A show output response characteristics of their corresponding light-receiving devices with respect to incident light having a large quantity (P=−3 dBm). FIGS. 5B and 6B show output response characteristics of their corresponding light-receiving devices with respect to incident light having a small quantity (P=−13 dBm). The chain line, broken line, and solid line in each graph show response characteristics obtained when the reverse bias voltage applied between the p-type and n-type layers is at 0.0 V, 1.0 V, and 7.0 V, respectively.

As these graphs clearly indicate, the bandwidth of the conventional light-receiving device deteriorates when the reverse bias voltage is low in the case where a large quantity of light enters the device (FIGS. 5A and 5B). By contrast, the light-receiving device in accordance with the embodiment yields an improved response output regardless of the incident light quantity even when the reverse bias voltage is low (FIGS. 6A and 6B). Therefore, the device in accordance with the embodiment can respond to a wide range of the frequencies of incident optical signals.

The light-receiving device in accordance with the embodiment has another advantage. That is, this light-receiving device has a low contact resistance. This is because that the electrode area for the p-type layer can be made wider than that for the n-type layer. In the conventional p-i-n photodiode, due to its structure, the electrode area on the p-layer side tends to be narrower than that on the n-layer side. Therefore, the contact resistance of p-type layer is smaller than that of the n-type layer by about one digit in general. As a result, the contact resistance tends to become greater in the conventional photodiode.

In the foregoing, the present invention is specifically explained with reference to an embodiment. However, the present invention should not be restricted to the above-mentioned embodiment. The present invention can arbitrarily be modified in terms of form, arrangement, configuration, and the like as long as such modifications do not depart from the scope of the claims.

In the above-mentioned embodiment, a p-i-n type is set forth as a light-receiving device. However, the light-receiving device in accordance with the invention may also be a pn type photodiode having a pn junction.

Figure 7:
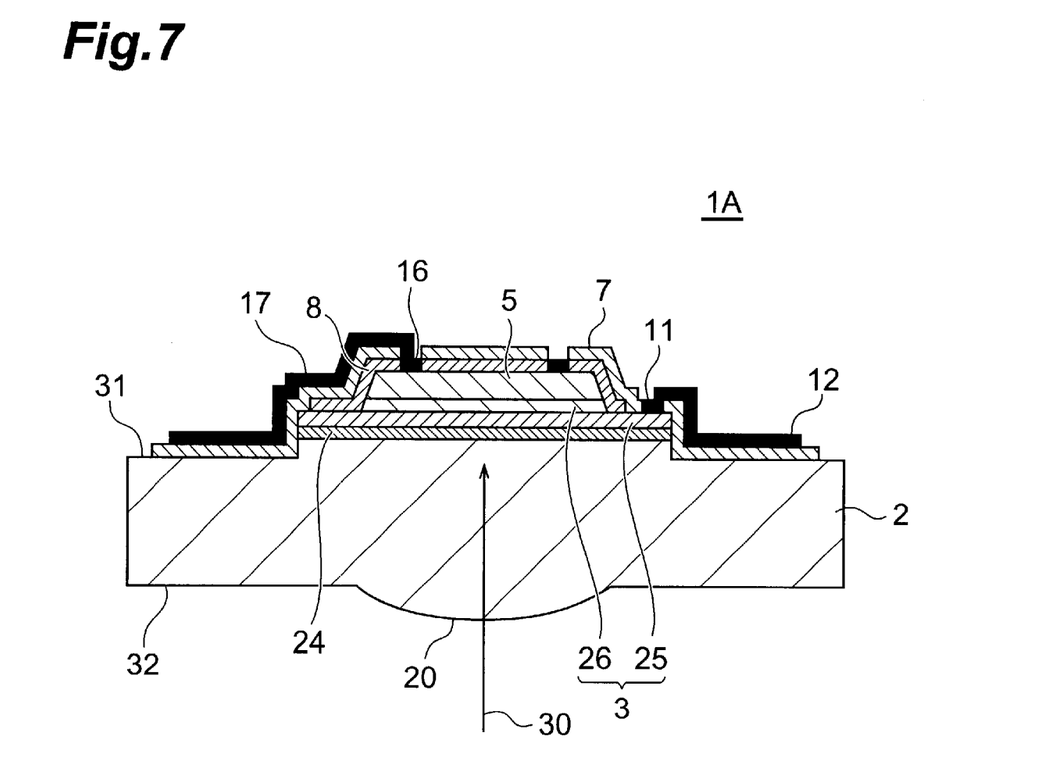
FIG. 7 is a lateral sectional view of another embodiment in accordance with the present invention.

FIG. 7 is a lateral sectional view showing an embodiment of the pn type light-receiving device in accordance with the invention. This light-receiving device 1A has a structure obtained by omitting the i-type layer 4 from the device 1 shown in FIG. 1. In the light-receiving device 1A, the n-type layer 5 is disposed in contact with the surface of the p-type layer 3. The pn junction is formed between the p-type layer 3 and n-type layer 5. The pn junction includes a depletion region. This region performs a function corresponding to the i-type layer 4 of the light-receiving device 1.

In the above-mentioned embodiments, dry etching is set forth as an etching process. However, wet etching may be used instead.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion in the scope of the following claims.

What is claimed is:

1. A light-receiving device comprising:
   a semiconductor substrate having a front side and a back side, the substrate including a light receiving portion on the back side;
   a diffusion suppressing layer disposed on the front side of the substrate;
   a p-type semiconductor layer directly disposed on the diffusion suppressing layer, said p-type layer containing a p-type dopant; and
   an n-type semiconductor layer disposed on said p-type semiconductor layer;
   wherein the diffusion suppressing layer restrains diffusion of the p-type dopant from the p-type layer into the substrate.

2. A light-receiving device according to claim 1, wherein said substrate is made of semi-insulating InP, and wherein said p-type layer and n-type layer are made of InGaAs.

3. A light-receiving device according to claim 1, further comprising an i-type layer interposed between said p-type layer and said n-type layer.

4. A light-receiving device according to claim 1, wherein said n-type layer is in contact with said p-type layer to form a pn junction.

5. A light-receiving device according to claim 1, wherein said diffusion suppressing layer is a Si-doped layer disposed on the front side of said substrate.

6. A light-receiving device comprising:
   a semiconductor substrate having a front side and a back side;
   a p-type semiconductor layer disposed on the front side of said substrate, said p-type layer containing a p-type dopant; and an n-type semiconductor layer disposed on said p-type semiconductor layer;

wherein said substrate includes a light-receiving portion, and wherein the light-receiving portion is disposed on the back side of said substrate, wherein the concentration of said p-type dopant in the second region is lower than that in the first region, and wherein the front side of said substrate has first and second regions with different heights, the first region being higher than the second region; and wherein said p-type layer and n-type layer are disposed on the first region.

7. A light-receiving device according to claim 1, wherein said light-receiving portion is integrally formed on the back side of said substrate.

8. A light-receiving device according to claim 7, wherein said light-receiving portion is an optical convex lens provided on the back side of said substrate.

9. A light-receiving device according to claim 1, wherein said p-type layer contains carbon as a dopant.

10. A light-receiving device according to claim 1, wherein the p-type dopant includes zinc.

* * * * *